United States Patent
Moll et al.

(10) Patent No.: US 6,292,762 B1
(45) Date of Patent: Sep. 18, 2001

(54) METHOD FOR DETERMINING A RANDOM PERMUTATION OF VARIABLES BY APPLYING A TEST FUNCTION

(75) Inventors: Laurent Rene Moll, Sunnyvale; Michael David Mitzenmacher, Milpitas; Andrei Z. Broder, Menlo Park, all of CA (US); Mark Alexander Shand, Dampierre-en-Yvelines (FR)

(73) Assignee: Compaq Computer Corporation, Houston, TX (US)

( * ) Notice: Subject to any disclaimer, the term of this patent is extended or adjusted under 35 U.S.C. 154(b) by 0 days.

(21) Appl. No.: 09/114,753

(22) Filed: Jul. 13, 1998

(51) Int. Cl.[7] .................................................. G06F 17/50
(52) U.S. Cl. .................... 703/1; 703/20; 703/23; 708/160; 713/1; 714/742; 717/8
(58) Field of Search .................... 703/20, 23, 26, 703/27, 1; 708/160; 714/742; 717/8; 713/1

(56) References Cited

U.S. PATENT DOCUMENTS

| 5,003,539 | * | 3/1991 | Takemoto et al. ................. 371/37.1 |
| 5,159,690 | * | 10/1992 | Margolus et al. .................... 395/800 |
| 5,164,943 | * | 11/1992 | Waggoner ................................. 371/3 |
| 5,623,548 | * | 4/1997 | Akiyama et al. ....................... 380/28 |
| 5,684,908 | | 11/1997 | Casselman ........................... 395/500 |
| 5,784,636 | * | 7/1998 | Rupp ............................... 395/800.37 |
| 5,856,986 | * | 1/1999 | Sobey .................................... 371/27.7 |
| 5,943,248 | * | 8/1999 | Clapp ............................... 364/718.01 |
| 5,983,022 | * | 11/1999 | Watkins et al. ....................... 395/708 |
| 6,028,939 | * | 2/2000 | Yin ......................................... 380/49 |

* cited by examiner

Primary Examiner—Kevin J. Teska
Assistant Examiner—Thai Phan
(74) Attorney, Agent, or Firm—Fenwick & West LLP

(57) ABSTRACT

A method determines a random permutation of input lines that produced a permuted set of bits in a bitstream. In a source design, the method replaces a logic element whose input lines are permutable with a test function. The source design is processed by a design tool to generate the bitstream including the permuted set of bits. The test function is probed with test values, and the probe results are compared with the permuted set of bits to discover the permutation of the set of bits. The test values can include a message.

15 Claims, 12 Drawing Sheets

METHOD FOR DETERMINING A RANDOM PERMUTATION OF VARIABLES BY APPLYING A TEST FUNCTION

FIELD OF THE INVENTION

This invention relates generally to Field-Programmable Gate Arrays, and more particularly to dynamically changing values used by the gate arrays using a modified configuration bitstream.

BACKGROUND OF THE INVENTION

The invention provides a solution for the following general problem. At first blush, this problem may appear purely hypothetical, however, such a problem does exist in the real world, and the invention provides a solution to the problem.

A "writer" stores logical zeroes and ones in locations of a table stored in a memory. During the writing, some arbitrary procedure, chosen by the writer, selects the addresses and values to be stored in the memory locations. After the memory locations have been written, the writer is denied write access to the memory.

Subsequently, an "adversary" permutes (scrambles) the address lines to the memory in some unknown manner, that is, the adversary secretly switches the address lines around.

A "reader" who knows the procedure used by the writer, but not the permutation applied by the adversary, must use the permuted address lines to correctly read the values stored in the memory by the writer. The goal is to discover how the address lines were permuted by the adversary, of course, without the adversary's cooperation, and, in addition, to have the writer communicate a message to the reader that is as large as possible using the memory as the communication channel.

In the real world, one type of circuit component that is sometimes used by system designers is a Field-Programmable Gate Array (FPGA). FPGAs combine the flexibility of software, and the speed of hardware. FPGAs are frequently used in applications where specialized high-speed processing of digital signals (data) is required: processing that would be unsuitable for general purpose processors executing conventional software. Typical applications where FPGAs can be found include: real-time video signal processing, data reformatting, pattern recognition, and data encryption. FPGAs are especially attractive to a one-of-a-kind or low volume designs where the development of traditional hardware solutions would be too costly and time-consuming.

Generally, FPGAs comprise the following basic components: input and output pins connected to internal pads, logic resources, flip-flops, and routing resources. The logic resources often are multiple replications of the same logic building blocks. For example, an elementary block of logic can be a look-up table (LUT) with two, three, four, or five inputs (address) lines. The LUTs are like ROMs or some other interconnected arrangement of gates that provide an equivalent functionality. For some LUTs, it is possible to actually write the "truth table" of the LUT and thus use the LUT as a RAM.

For all the FPGAs, the programmable gates are configured by a configuration bitstream produced by an FPGA software tool from a "design" corresponding to the application to be implemented in the FPGA. For example, the logic elements of a "design" can be implemented using the equivalent of Read-only Memory (ROM) elements configured as a look-up table (LUT). In essence, the LUT operates as a logical function, input value on "address" lines are used to "index" the LUT and corresponding logical values (zeroes and ones) stored in the LUT at the indexed address are returned as output values, hence a transformation.

To set initial logical values in an FPGA LUT, for example, initializing a truth table when part of the FPGA is used as logic function, the input is specified as part of the FPGA "circuit" in source design form. The source design is processed by the FPGA design tools to obtain a new configuration for the FPGA. The FPGA tools perform operations such as mapping the logic parts of the design to the elementary logic elements of the FPGA, placing those mapped elements, and routing the wiring between the elements. After the mapping, placement and routing phases, the tools have the complete map of all the configuration that the FPGA needs to perform according to the original design. From this map, the tools generate a configuration bitstream ready to be downloaded to the FPGA. Once configured, the FPGA can be used according to the design.

These FPGA design tools, depending on the complexity of the source design, take anywhere from minutes to hours to complete their processing of the source design definitions. After the FPGA has been configured, data can be processed.

For some application, such as pattern matching and encryption, it is beneficial, in terms of silicon space and speed, to produce slightly different instances of the "design" for each different pattern or key processed, rather than using a single "design" accepting different patterns or keys, with all the machinery to load and store new patterns or keys. For example, if a user key is used to encrypt user data, then the key needs to be changed for every different user. In such applications, circuits used to load different keys would take extra space. For these applications, it would be useful to be able to change directly the small part of the "design" that is specific to a key or pattern directly in the configuration bitstream, rather than to do a full FPGA tool cycle each time. Also, if the changes have to be made outside of a development environment, for example, in an FPGA embedded in an end-user machine, then the FPGA design tools may not be readily available to change the run time values.

FIG. 1 shows the phases and general data flow of a traditional FPGA design cycle. The input to the flow is some source design 110 that includes logic elements 111 and 112, where 112 is a particular element that fits into one of the elementary LUTs of the FPGA, a four-input LUT in FIG. 1. The source design 110 transforms some input data to output data 114. The source design 110 includes, for example, logical elements $S_0$, $S_1$, $S_2$, and $S_3$ that are to process input data connected to inputs $x_0$, $x_1$, $x_2$, $x_3$ of a LUT 112 of the FPGA by lines 115. The elements 111 are arbitrary, what is of interest here is the input data on lines 115. Most of the FPGAs are based on either 3 or 4 or 5 input table LUTs as elementary logic blocks.

In this case, the LUT 112 is "indexed" according to the data on the four inputs $x_0$, $x_1$, $x_2$, $x_3$ 115. For each input value in the range of 0 to 15, the LUT 112 provides either a zero or a one as output on line 114. In other words, the LUT 112 stores sixteen zero or one bits in a vector that form the truth table for the possible input data values, and the logic elements are to be combined to perform some function $f(x_0, x_1, x_2, x_3)$ on the input data to produce output bits on line 114. Note that logical element $S_0$ is connected to input $x_0$, and so forth.

In phase 10, the design tools take the source design 110 to generate a "mapped" design 120 for the actual target FPGA. Note, the mapped design 120 does not directly correspond to the original source design 110. After the source design 110 has been mapped by the tools, a configuration bitstream 131 is produced.

A shaded portion 132 of the configuration bitstream 131 corresponds to the initial sixteen values (x ... x) of the LUT 112. Tables 133 and 134 respectively show a mapping of a function as determined in the source, and comparable function g as determined by the tools. The positions of the bits are shown as in hexadecimal (bold) and binary form. At this point, note that these are different, in other words, function g is a permutation of functions f. The values (x, ..., x) 132 in the bitstream 131 contain no indication how they are ordered.

For applications like the ones presented above, where the "design" has to be slightly changed, usually values of LUTs, FIG. 2 shows the major steps of the prior art design process 200. A source design 210 and initial values 220 are presented to FPGA design tools 230, as in phase 10 of FIG. 1. The tools 230 produce a configuration bitstream 240. In step 250, the configuration bitstream is loaded into the FPGA, and the mapped design is used during a "run." In step 260, a decision is made to process data with different initial values, and steps 230 and 240 are repeated. For a complex design, each cycle may take hours with static assignment of new initial values at the start of each cycle.

During the mapping phase 10 of FIG. 1 or step 230 of FIG. 2, some tools allow the designer to explicitly specify the correspondence between the logical source address lines and the physical placement of the lines to an FPGA internal structure. In this case, there is less difficulty. However, many tools do not provide for this correspondence, and may scramble the input lines to the LUT in some unknown permuted manner. Therein lies the problem. Going back to FIG. 1, the relationship between the functions f and g with respect to like bits in part 132 are completely unknown.

For a conventional application, where the initial values are statically determined and do not need to change for each run, the unknown permutation on internal inputs is not a problem. This is true because the tools make sure that the overall outcome is logically correct with respect to the source design, no matter what the implementation of the mapped design. In addition, the time required to map the source to the physical wiring of the FPGA is not a concern. However, explicit input placement may limit the ability of the tools to optimally place and route the circuits, and in some cases, explicit placement makes it impossible for the tools to map the source to a working arrangement.

For some applications, it may be desired to allow the initial values to be modified dynamically during the operation of the FPGA without having to resort to a lengthy run of the FPGA tools. For example, periodically, new initial values would be patched directly into the configuration bitstream, and the FPGA is "reconfigured" on-the-fly. This could only be done if the ordering of the input on the LUT, and other like FPGA structures is known. If the ordering is known, then truth table bits can be put in the configuration bitstream in the correct order without having to suffer a full design cycle.

The purpose of the invention is to discover the permutation that FPGA design tools introduce between the order of inputs of internal components, such as LUTs, as specified in a source design and the order in an actual physical mapping of the design. If the ordering can be determined, then dynamic modification of LUT values becomes possible.

SUMMARY OF THE INVENTION

The invention provides a method for discovering a permutation of input lines of a logic element introduced by FPGA tools in the processing of a "design". Knowing the permutation, it is possible to modify the truth table of the logic element directly without fully reprocessing the source design.

More particularly, the method according to the invention provides a method that determines a random permutation of input lines that produce a permuted set of bits in a bitstream. In a source design, a logic element, whose input lines are permutable, is replaced by a test function. The source design is processed by a design tool to generate the bitstream including the permuted set of bits. The bitstream is used to configure the FPGA. The processing of the design can permute the input lines of the logic element. This purmutation can be seen in the bitstream as a set of permuted bits.

The test function is probed with test values, and the probe results are comparing with the permuted set of bits in the bitstream to discover the permutation. Test values can include a message.

In a practical application, the source design is for an FPGA, and the logic element that is replaced by the test function is a look-up table. It is the input address lines of the look-up table that may be permuted by the tools. The present invention discovers how the tools permute the address lines.

DETAILED DESCRIPTION OF PREFERRED EMBODIMENTS

Introduction

The main idea of the invention is to discover unknown permutations of input lines to logic elements introduced by Field-Programmable Gate Array (FPGA) design tools using a carefully chosen test function specified in a source design. The test function replaces the logic element which will be permuted by the tools. The source design, including the test function, is processed once by the tools. Then, using the test function, the permutation applied by the mapping of the tools can be determined. With this knowledge, new values can dynamically be provided to the FPGA as part of a configuration bitstream without having to use the design tools to generate the configuration bitstream, thus saving time.

Processing a configuration bitstream takes only microseconds, as compared with possibly hours of prior art design cycles, and therefore can be done with a minimal interruption of the application. On some recent FPGAs, it is even possible to reconfigure only the part of the design that has changed, further reducing the interruption time.

Permutation Discovery and Patching

Figure 3:
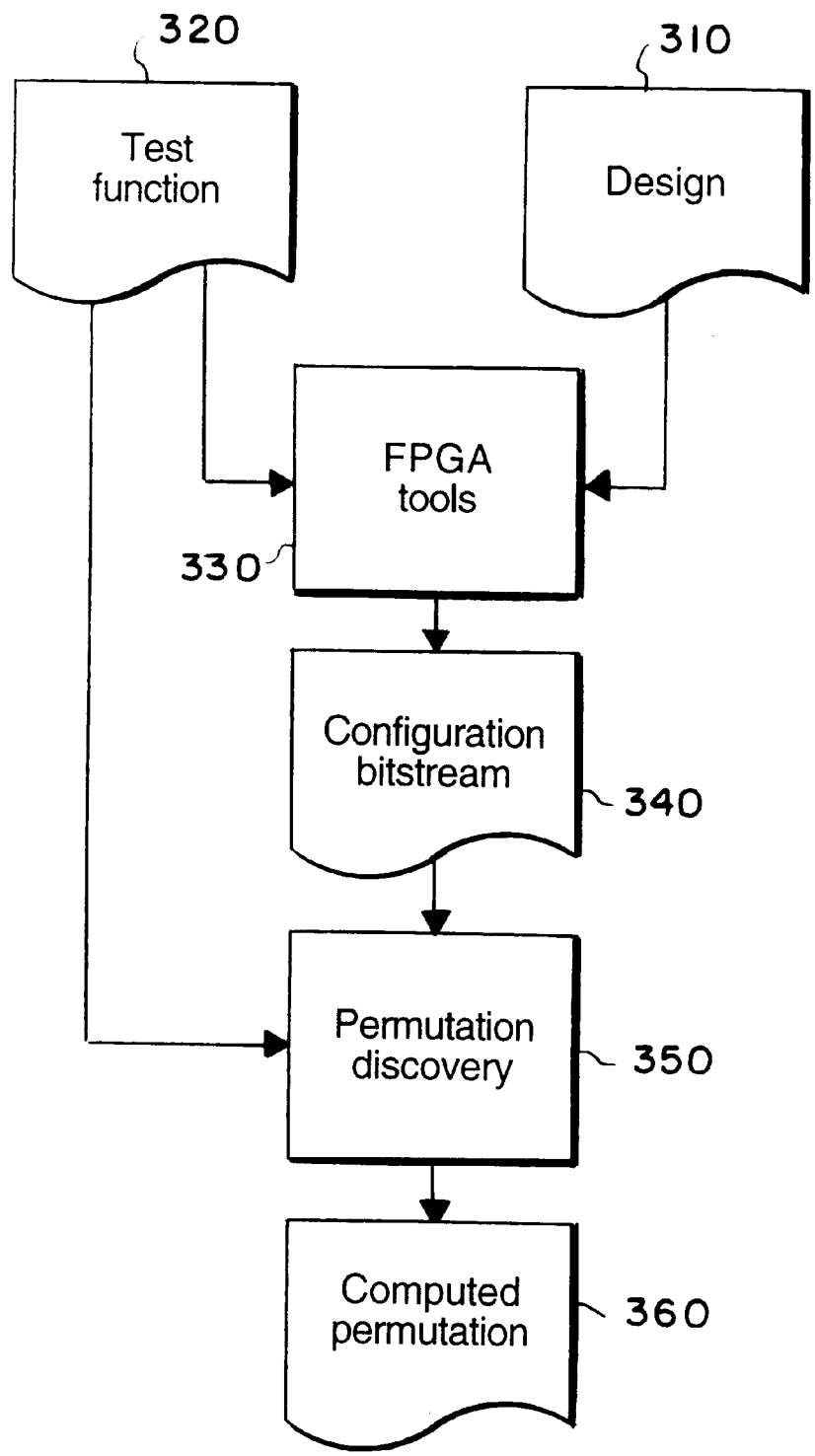
FIG. 3 is a flow diagram of the steps for discovering a permutation of address lines.
Figure 4:
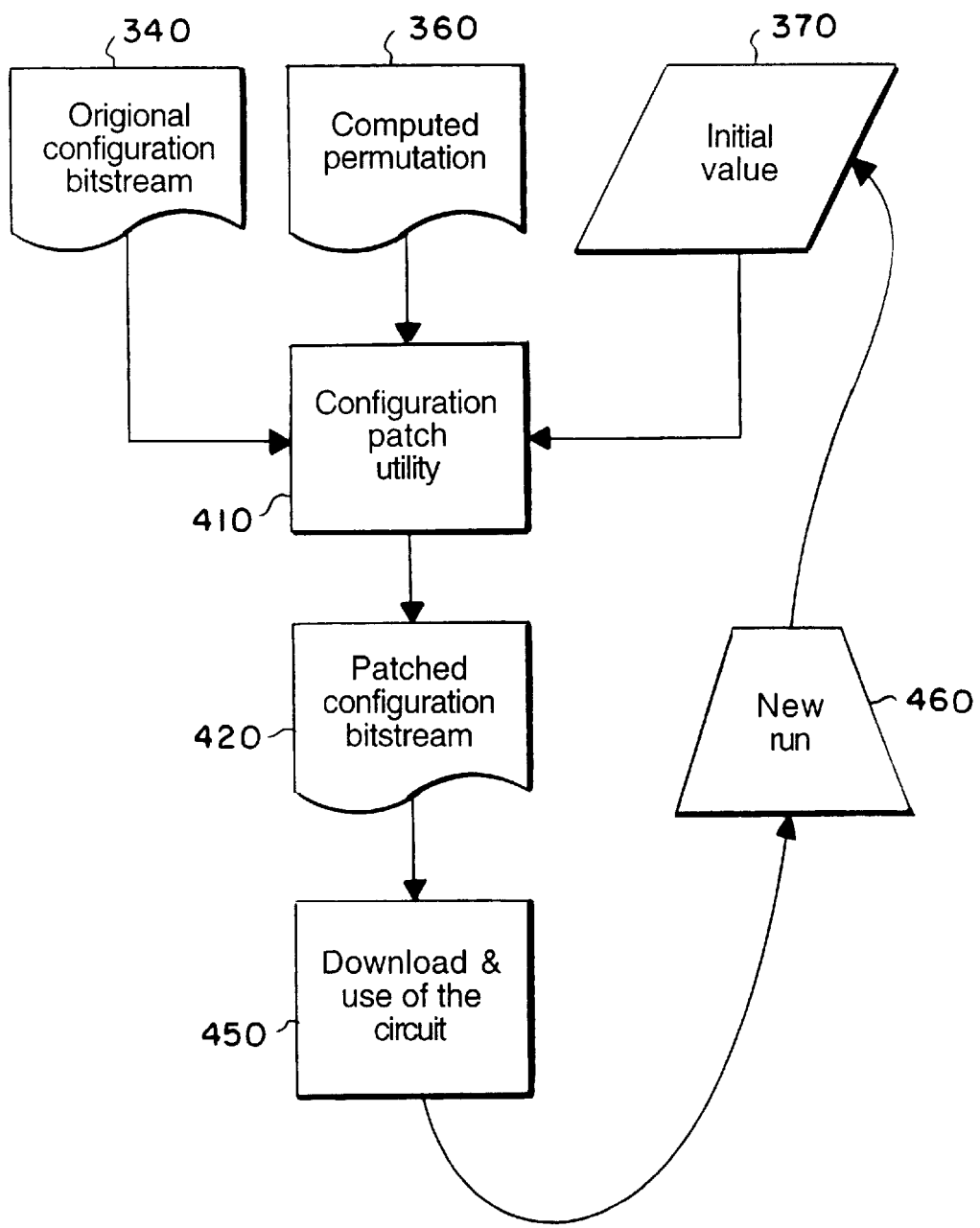
FIG. 4 is a flow diagram of the steps for using the discovered permutation to dynamically modify a configuration bitstream for the FPGA.

FIGS. 3 and 4 show the steps of a method according to the invention for discovering the permutation of the FPGA design tool, and making modifications to the FPGA in real-time. In FIG. 3, an FPGA source design 310 including a special test function 320 are provided as input to the FPGA design tools 330 for mapping. The special test function 320 replaces a logic element that is to be change at run-time, and whose address lines are susceptible of being permutted by the design tool.

As an advantage, and as described in detail below, this input needs to be mapped only once. In step 330, a configuration bitstream 340 is generated. The configuration bitstream 340 is used by a software component 350 along with the test function 320 to discover the permutation. Specific solutions that can be implemented by the software 350 to discover the permutation are described below.

Continuing with FIG. 4, after the permutation 360 is discovered, the configuration bitstream 340 can be "patched" according to the permutation 360 with "real" values 370 in step 410 to generate a "patched" configuration bitstream 420. Actual production data are processed in step 450. When a new run has to be done, the application is temporarily stopped in step 460 and new initial values 370 are fed to the software patching component 410. As an advantage, "patching" of FPGAs can be done in milli- or microseconds.

The hard part of a practical implementation of the invention is the choice of the test function 320, and the discovery of the permutation in step 350. Disclosed herein are solutions for test functions and discovery procedures that work for a permutation of any number of input lines.

Quality Metrics

In addition to determining the permutation, defined is the concept of spatial and temporal quality metrics of the test function.

Spatial Metrics to Maximize Message Size

If the permutation discovery procedure needs fewer bits in the truth table of the test function than are available, i.e., bit values in a look-up table (LUT), then it is possible to use some of the other bits for other purposes. For example, if a LUT stores sixteen values, but only seven are used by the test function, the other nine available "entries" in the LUT can be used to store a message. The message can be used in a number of different ways. For example, the message can provide actual data with the test function, or the other bits in the unused space of the truth table can be used to store "fingerprints" of different instances of the function, that is, the message can uniquely identify an instance of a test function. The message can also contain actual data values.

Using this fingerprinting mechanism, the different function applications can be recognized during operation of the FPGA, no matter at what arbitrary location the FPGA design tools has placed them. The spatial quality metric of the test function considers the total number of bits in an associated truth table that are not used by the discovery algorithm. The larger the amount of unused space, the better the test function.

Temporal Metrics Including Complexity

The temporal quality metric of the test function measures the amount of time required to discover the permutation. The time is proportional to the complexity of the discovery method and the number of "probes" that need to be made to discover the permutation. The number of probes is less important than the complexity. Described are test functions and associated discovery procedures ("solutions" below) that simultaneously produce good spatial and temporal quality metrics. In particular, the metrics are within a low order additive term of provable lower bounds for the problem. The probes can be made by the software 350.

The two quality metrics, the size of the maximum message and the number of probes necessary to discover the permutation are exclusive. If one wants to put as big a message as possible, it will be necessary on the receiving side to probe the test function with all the initial values to decode the message. However, in a real application, the number of probes does not matter as much as the size of the message. From a temporal perspective, the complexity of the discovery procedure is more important.

This metric cannot be measured as precisely as the metrics above, but it is important that choosing a test function, encoding a message, discovering the permutation, and decoding the message are possible in a reasonable amount of time. The complexity metric, as described below, allows one to identify practical procedures.

Optimal Procedures and Bounds

Maximum Message Size

If n is the number of inputs, there are factorial n (n!) different permutations. A simple counting argument where each input (bit) used partitions the permutation search space into two parts, sets a hard limit to the minimum number of bits that must be "consumed" to do the permutation discovery to $\log_2(n!)$. The maximum number of bits the message can have is then $2^n - \log_2(n!)$. This bound can not be reached. An optimal method for the message size metrics can be determined by making an exhaustive classification of all the test functions as described below.

Number of Probes

For the "number of probes" metric, there exist a lower bound that is $\log_2(n!)$. However, this lower bound cannot be reached for the same counting reason as stated above. A one-time exhaustive search can find the optimal procedure for any $n \leq 5$.

Trade-offs and Complexity of Algorithms

Given the two metrics mentioned above, it is difficult to define any single optimum solution for a given value of n, although the optimum for the first two metrics is known, and anything else will be somewhere between those two. This makes the complexity metric interesting as it allows one to accurately identify practical procedures.

The following solutions are described below:

I) an optimal solution using exhaustive classification which is practical for $n \leq 5$;

II) a simple solution for the case where n=4;

III) a series of practical solutions for n=4, which is the case of interest, since it is common to use a look-up table with four inputs, and logically equivalent larger tables can be built from combinations of four input tables; and IV) a combination of solutions which yields the optimal solution.

Solutions Used for FPGA Elements Other Than Look-up Tables

Some FPGAs do not use LUTs to implement the logic resources. They use much less regular sets of gates with programmable connections. The result is still a function of n binary inputs and 1 binary output. However, the function is more constrained than a full LUT. In this case, depending on the kind of element used, it may still be possible to apply the invention to discover permutations for other FPGA logic resources.

Direct Use of the Configuration Bit-stream

In the method of FIGS. 3 and 4, the original configuration bitstream 340 and the patched version 420 containing useful data. For some applications however, it may not be practical to keep both an original configuration bitstream and patched bitstreams.

Figure 5:
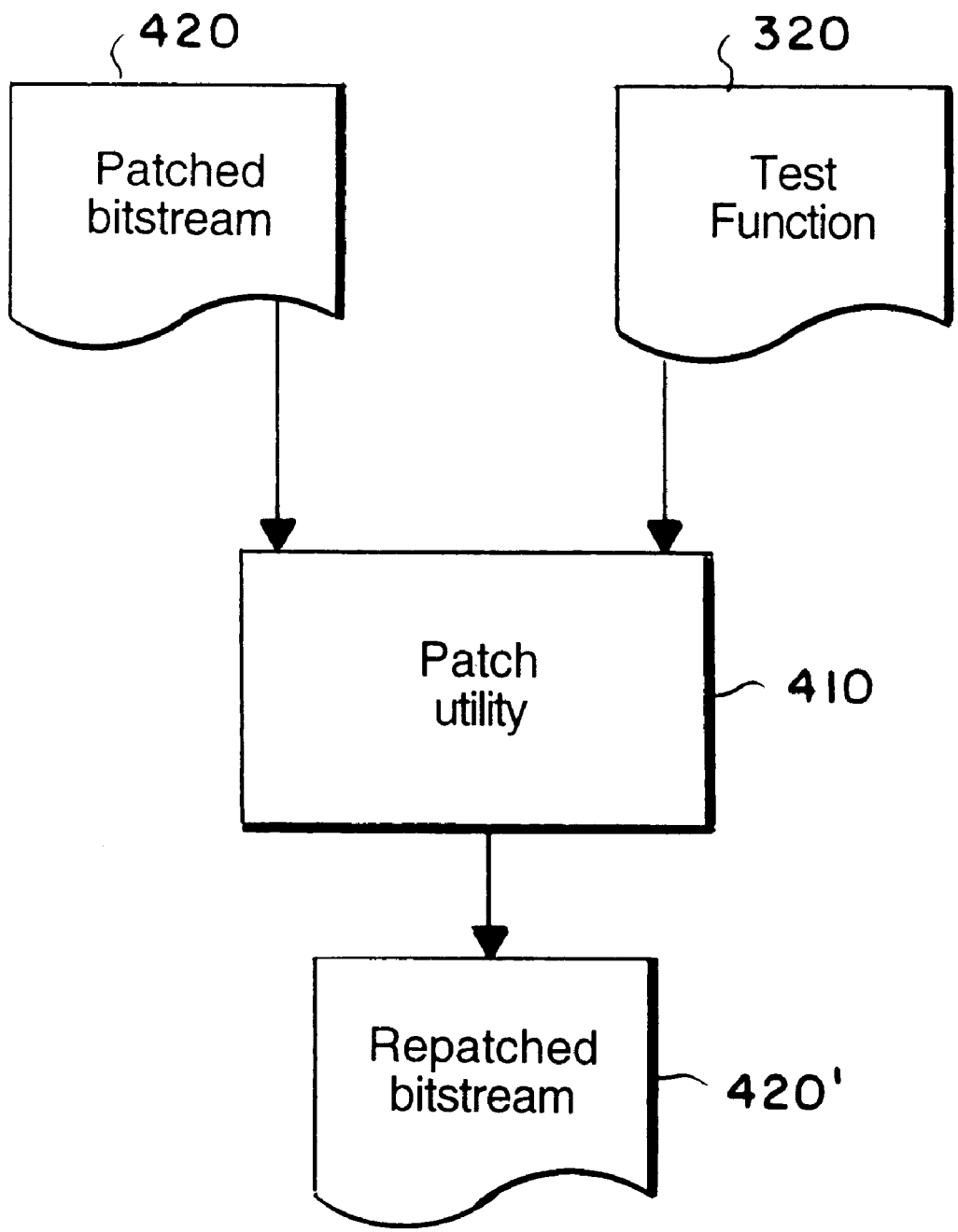
FIG. 5 is a flow diagram of steps for generating a usable bitstream from a previously patched bitstream that can still be used for discovering a permutation.

For instance, if the invention is used to patch some type of static information in a configuration bitstream and the patching mechanism is not used very often, then it is much more practical to always store a single bitstream which can also be used to discover the permutation. This makes it possible to patch the bitstream, and to have the bitstream contain meaningful data, as shown in FIG. 5.

Each time the bitstream 420 is patched, the patch utility 410 makes sure that the replacement data (test function 320) still permit the discovery of the permutation. This is a slight modification of FIG. 4, as the "original configuration bitstream" 340 is forgotten. In FIG. 5, the original configuration bitstream 340 is replaced by the new "patchable" configuration bitstream 420' which has the same property of enabling the permutation discovery using some selected test function 320, but with different initial values for the "free bits" (message bits). In this case, a "repatched" bitstream 420' is produced.

In this case, the number of information bits that can go through the process is crucial. This number is the same as the "message size". It is clear, however, that the arrangement of the message bits in the test function is not very practical for an internal use of the LUT in the circuit. For the "Solution 4-2 with overlapping" described below, the message bits are at address positions 1100, 0100, 0001, 0111, 1011, 1101, 1110, 0000, 1111. These addresses are not consecutive.

Knowing the test function 320 that is going to be used, it is possible in this case to voluntarily introduce an intermediate encoding stage in front of the input lines of the LUT, so that the message bit values, nine in this case, appear contiguous. The encoder can be an n-input/n-output objective function. In the example, take a function e() so that e(000)=1100, e(0001)=0100, e(0010)=0001, e(0011)=0111, e(0100)=1011, e(0101)=1101, e(0110)=1110, e(0111)=0000 and e(1000)=1111.

This would give the user the choice of the first nine values of the LUT (the "message") while the discovery of the permutation is still possible. This encoding stage doesn't modify the discovery process. It just allows the message bits to appear in order instead of at random positions. Of course, the patching utility 410 must know about this intermediate coding so that the data it embeds in the bitstream look correct from the other side of the encoder.

If it is important only for the "original configuration bitstream" 420 to contain meaningful bits, then more message bits than the normal "message size" can be encoded. In the case of n=4 and the "Solution 4-2 with overlapping", besides the message bits, there is still a number of 1s and 0s taken by the solution. By using the above address encoding, it can be ensured that the first 12 bits of the 16 that can be addressed can look like any desired data. The standard "message" bits is used for part of it, and the mandatory 0s and 1s of the test function are used for the rest. The address encoding function is used to place the remaining 0s and 1s in the good order, so that the first 12 bits, for instance, look like a message that can be processed.

SOLUTIONS

As described below, the following general classes of solutions are given. An optimal solution using an exhaustive classification. A simple solution for a particular sized LUT (four inputs). A series of practical solutions for the four input LUT, and combinations thereof which provide an optimal solution.

I—Optimal Solution using Exhaustive Classification

Figure 6:
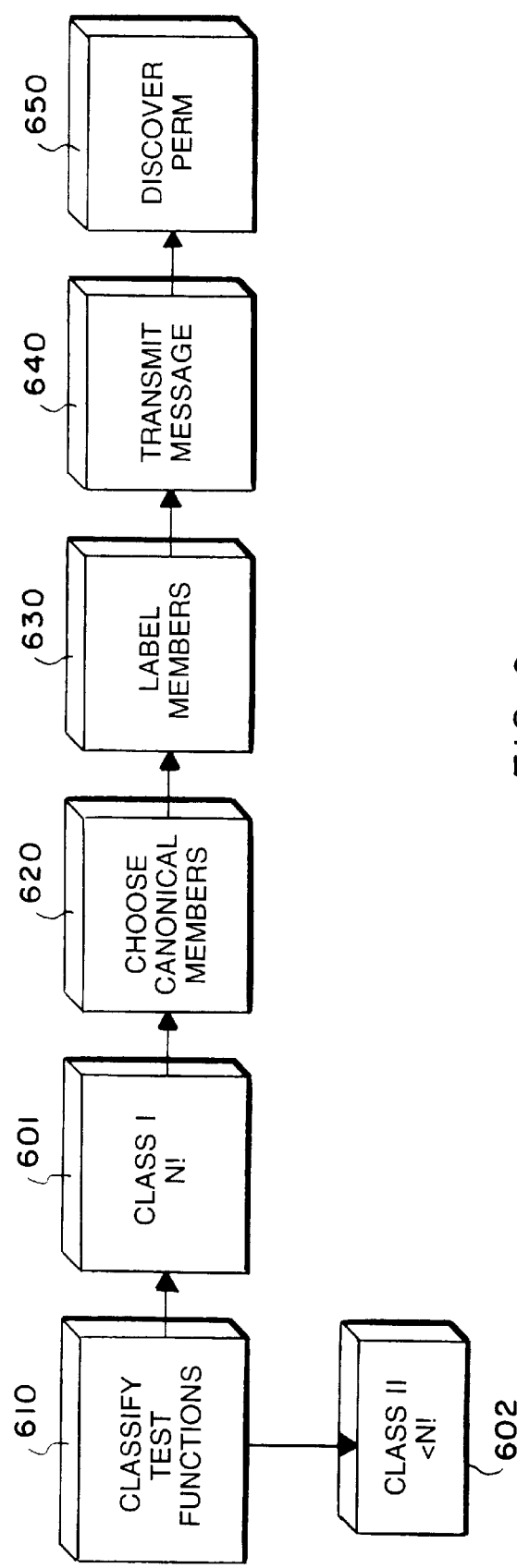
FIG. 6 is a flow diagram for transmitting a maximum-sized message and discovering the permutation using an exhaustive search of the test functions space.

FIG. 6 shows the steps for discovering the permutation using an exhaustive classification. During classifications 610, all possible test functions are put in equivalence classes, where each function is a permutation of any other test function in the same equivalence class, and the test function has no relation with function in other equivalence classes. This leads to two kinds of classes:

I. Classes of cardinality n! are the useful classes (Class I) 601. If a test function is taken from one of these useful classes, the n! permutation will produce n! different result functions. Thus, if a permutation is applied to any of these functions, then the comparison between the original function and the resulting functions always permits one to identify the applied permutation.

II. Classes of cardinality<n! are useless classes (Class II) 602 that cannot be used for permutation discovery because any test functions in any of these classes do not produce n! different result functions through the n! permutation, but only the cardinality of the class.

Therefore, the only classes of interest are the first type of Class I 601, with a cardinality equal to n!.

In step 620, choose in each useful class 601 a canonical member, e.g., the function with the smallest truth table for some total order. Label each of the canonical members, and thus all the classes, with consecutive integer numbers starting at zero in step 630. For instance, one could sort all the canonical members, and label the members with their sequence number in the sorted array. Message can be viewed as or converted to an integer number in the range of the possible labels in step 630.

For each choice of a test function, transmit a message, and discover the permutation in step 640. The sender encodes the message by using as test function the canonical member labeled with the message. The message is some positive number strictly smaller than the number of classes divided by the number of canonical members.

In step 650, the permutation is discovered by the receiver of the message. The receiver takes the permuted function, applies all the n! permutations to its inputs, and sorts the n! resulting functions. In the example used above, the smallest of all these functions is the canonical member of the class which contains the permuted function.

A simple lookup in the canonical member tables gives its label, which corresponds to the message itself. The permutation used to go from the permuted function and the canonical member is the inverse of the random permutation that is to be discovered. It is obvious that the message is between 0 and the number of classes. The maximum number of bits of the message is then the $\log_2$ of the number of classes.

Experimental data on the number of useful classes for different values of n are given in Table A below.

TABLE A

| n | Nb classes/ max message | Message size (log$_2$ of previous) | Theoretical bound: log$_2$(n!) |
|---|---|---|---|
| 2 | 4 | 2 | 2 |
| 3 | 16 | 4 | 5.42 |
| 4 | 1792 | 10.81 | 11.42 |
| 5 | 34339072 | 25.03 | 25.09 |

For n=6, the search space is $2^{64}$, which is way too big to be computed. The procedure described above is usable, however, it requires the building of a very large table, which can be time and space consuming for the case where n≦4, almost impossible for n=5, and practically impossible when n≧6. The search through the table is equally hard.

The exhaustive solution is optimal but hard to use in practice. For n=4, it requires the storing of 1792 canonical members, each of which is 16 bits long.

II—Simple Solution for any n

For n inputs (where n is a power of 2), the preferred procedures require at most $n.\log_2(n)$ bits in the truth table, and $n.\log_2(n)$ probes of the test function. The case where n is not a power of 2 can also be handled.

A summary for solution of the problem for a set of test functions and discovery procedures for all the possible element sizes is now presented, details and practical examples are given below.

For n source inputs of, for example, an FPGA a look-up table, the inputs can be labeled 0 to n−1. Similarly, the internal inputs of the LUT, after configuration can also be labeled 0 to n−1. The key to the present invention is to discover the actual permutation applied by the design tools in a bit-by-bit manner.

The discovery process can be partitioned into a number of phases. In each phase, for each source input i, the mapping of one additional bit is determined for one of the internal inputs j by making one probe with the test function. In total, n probes are used during each phase, with a total of $\log_2(n)$ phases. Hence, $n.\log_2(n)$ probes are required, and the same number bits in the truth table.

Figure 1:
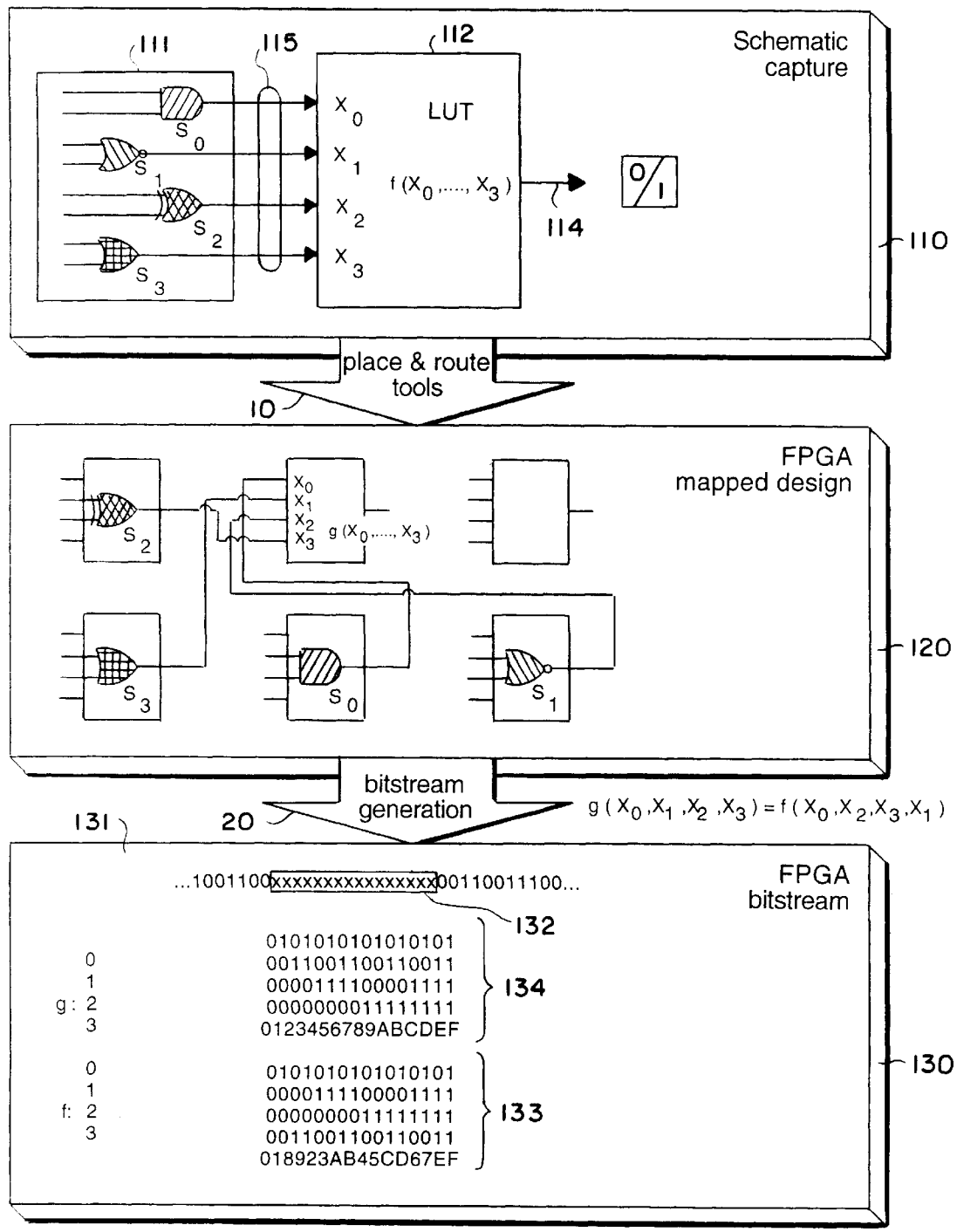
FIG. 1 is a flow diagram of the phases of a design cycle for a Field Programmable Gate Array.
Figure 2:
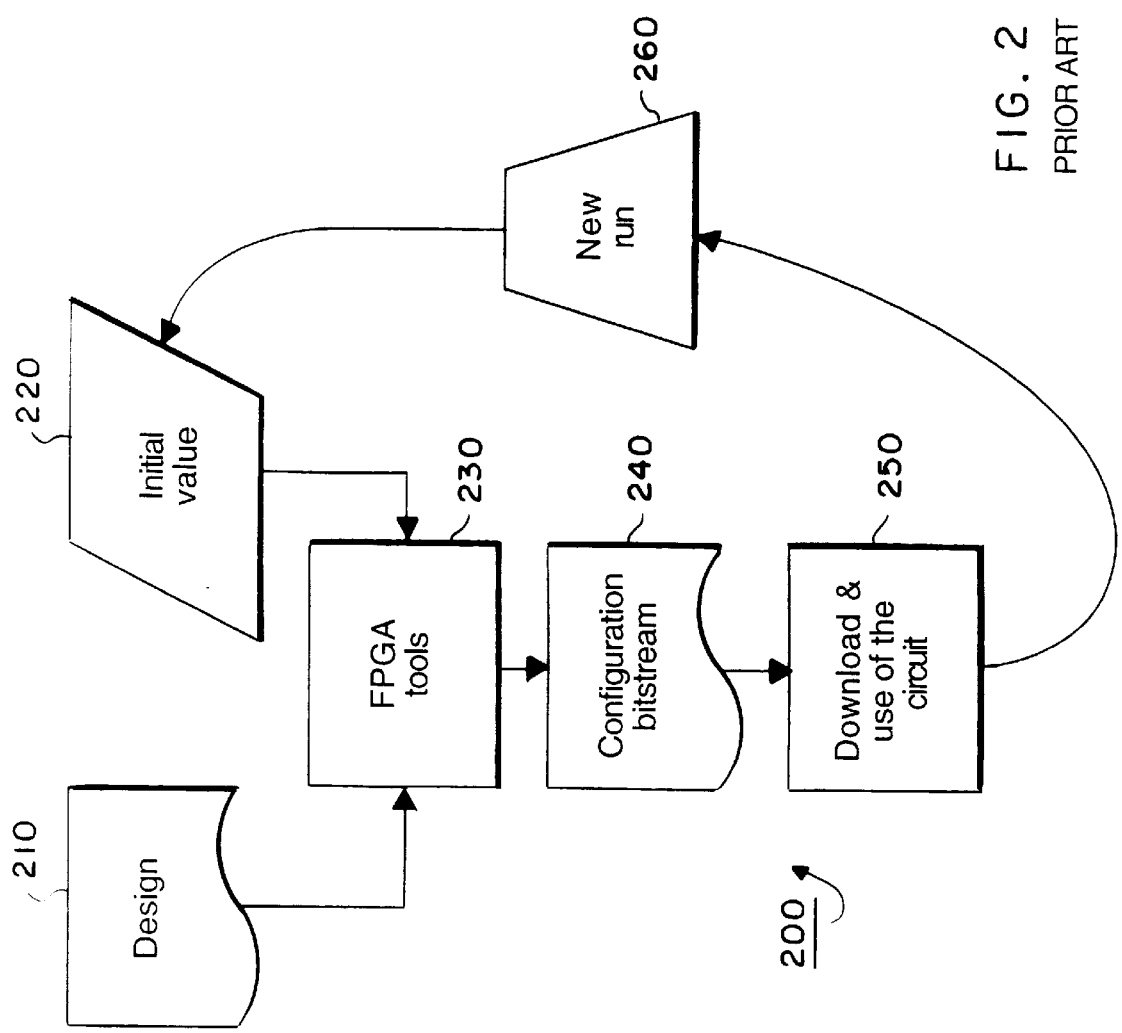
FIG. 2 is a flow diagram of the steps of a prior art repeated design process.

As shown in FIG. 1, a look-up table (LUT) 112 of an FPGA device has a set of n inputs, for example, $x_0$, $x_1$, $x_2$, $x_3$, each capable of receiving one bit of input data. The FPGA design tools permute the source inputs to a set of internal inputs in some unknown manner. Some test function of {0, 1} is applied to the input of the FPGA, processed by the LUT, and evaluated at the output of the FPGA to determine the permutation from the source input to the LUT to permuted internal input to the LUT.

One way to describe this problem is as follows. Functions f and g are chosen from $\{0,1\}^n$ to $\{0, 1\}$. The functions f and g are related by $g(x)=f(\pi(x))$, where x is an n-dimensional {0, 1} vector, and π is a permutation of the entries of this vector. The function g expresses what is seen on the output when the function is applied at the input.

For specific inputs x, values for f(x) are stored in a truth table of the FPGA memory, i.e., a look-up table. The goal is to find π. A primary consideration is to minimize the number of truth table entries that need to be stored for the function As a secondary consideration, it is also desired to minimize the number of evaluations (probes) for the function g. In other words, space is at a premium, probes are relatively cheap because probes can be done with a small number of software instructions by the discovery software 350 of FIG. 3.

For convenience, π expresses the permutation on the numbers (positions) 0 to n−1. Described is a procedure that only stores $n.\log_2 n$ values of $f$ in the truth table, and the function g is evaluated only $n.\log_2 n$ times when $n=2^r$.

If there are $n=2^r$ input positions, then it is possible to discover the permutation π after r rounds. In each round, n new positions are set in the truth table, for a total of $n.\log_2 n$ values of f that need to be stored. The following invariant is maintained: after round k, for each position i, the least significant k bits in the binary representation of π(i) are known.

Note, this invariant is trivially true during the initial round. For the first round, g(x) is determined for all unit vectors x; that is, determined are g(x) for all x with a single logical "1" entry. The truth table stores values of f(x) for all unit vectors x. Values f(x) are set to 1 for all unit vectors that have a 1 in an odd position, and 0 for all unit vectors that have a 1 in an even position. As $g(x)=f(\pi(x))$, this yields the first bit of π(i) from the right for all i.

For all subsequent rounds, g(x) is determined for all vectors x of the following form: x has a 1 in all positions j for which the first k−1 bits of π(j) from the right are known to be $\dot{z}_1, \dot{z}_2, \ldots, \dot{z}_{\{k-1\}}$, and x has a single additional 1 entry in some position i such that the first k−1 bits of π(j) from the right are known to be $\dot{z}_1, \dot{z}_2, \ldots, \dot{z}_{\{k-1\}}$.

The truth table stores values of f(x) for all x which have a 1 in the positions where the first k−1 bits from the right are $z_1, z_2, \ldots z_{\{k-1\}}$ and have a 1 in a single position where the first k−1 bits from the right are $\dot{z}_1, \dot{z}_2, \ldots, \dot{z}_{\{k-1\}}$. Note that there are n such vectors x, and they distinct from those x from previous rounds. The function f(x) is set to be 1 if the single position where the first k−1 bits from the right are $\dot{z}_1, \dot{z}_2, \ldots, \dot{z}_{\{k-1\}}$ is such that the kth bit from the right is 1, and 0 otherwise. Again, as $g(x)=f(\pi(x))$, evaluating g at these x yields the kth bit from the right of π(i) for all i.

As the invariant is maintained, it can be shown that there is a need to store the results for $n.r=n.\log_2 n$ values of f in the truth table. Next, consider when $n=2^r+a$, where $0<a<2^r$. In this case, use an (r+1)th round for positions which are not determined by the first r bits from the right. The same argument shows that the total number of truth table entries and evaluations of g required is $n.r+2a=n.\lfloor \log_2 n \rfloor+2a$.

III—Particular solutions for n=4

Here, sixteen very simple examples are given with different performance. The examples can be combined to give a solution that reaches the optimal message size metric. The solutions for four-input LUTs is particularly interesting because this is the elementary building block that is used by the most popular FPGAs.

In describing these examples, the following notation will be used. The FPGA look-up table, or ROM has n inputs, and therefore, there are $2^n$ memory locations or bits in its truth table. A message M has l bits $m_0, \ldots, m_{l-1}$. The test function is f, and $f(a_0 a_1 a_2 a_3)$ is a memory location of f that stores either zero or one bits. The function g is the permuted function. The solutions have been "named" to somewhat reflect the test pattern. For example, 4-2 means that out of the six bit values f(0011), f(0101), f(0110), f(1001), f(1010), and f(1100), either there are four 0 and two 1 or four 1 and two 0.

Figure 7:
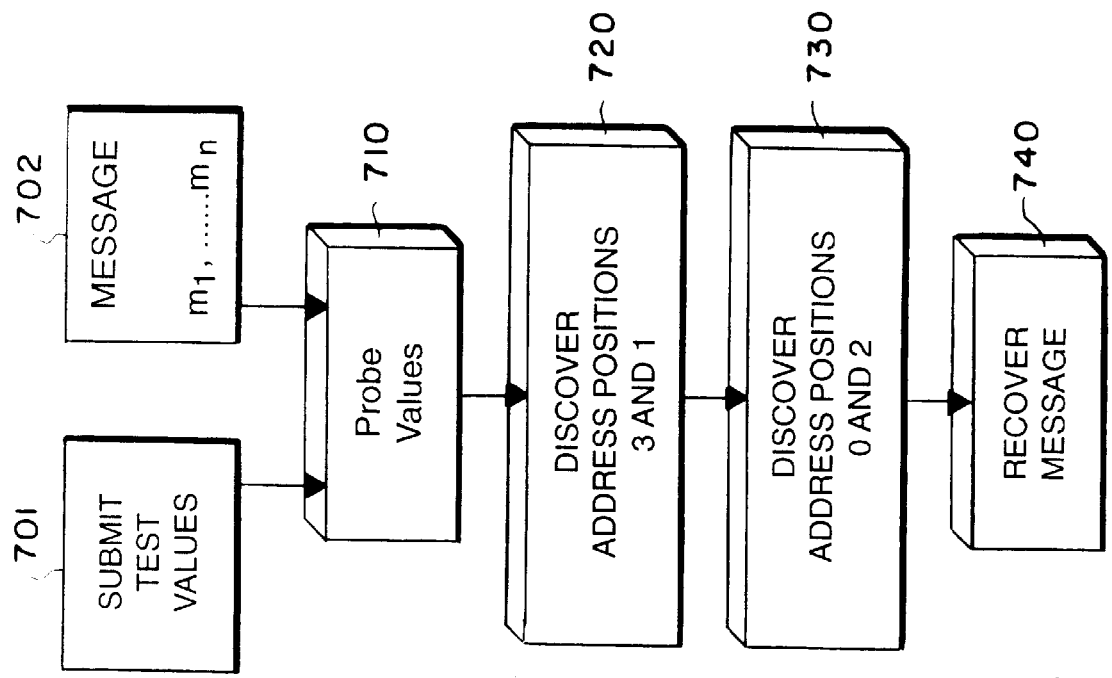
FIG. 7 is a flow diagram for discovering the permutation for a specific simple solution of a four input lookup table.
Figure 8A:
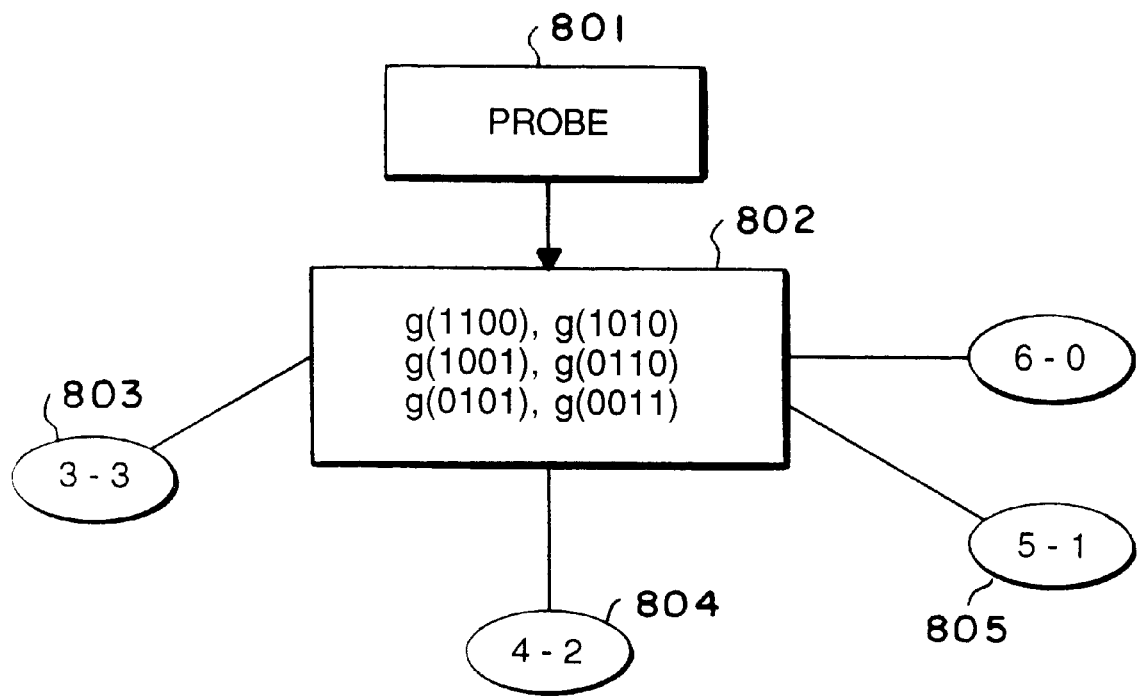
FIGS. 8A–8D are a flow diagram for discovering the permutation using combinations of solutions.
Figure 8B:
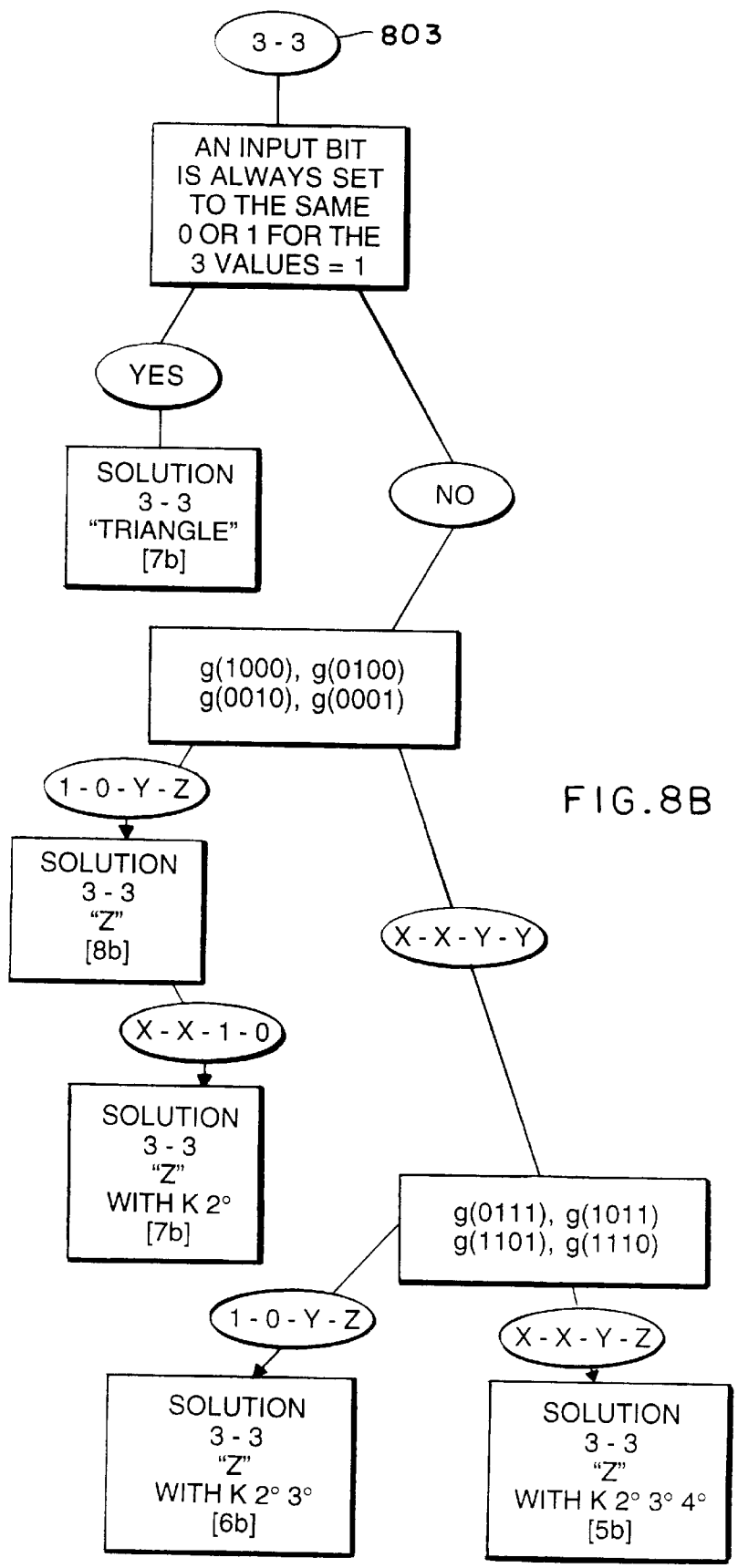
Figure 8C:
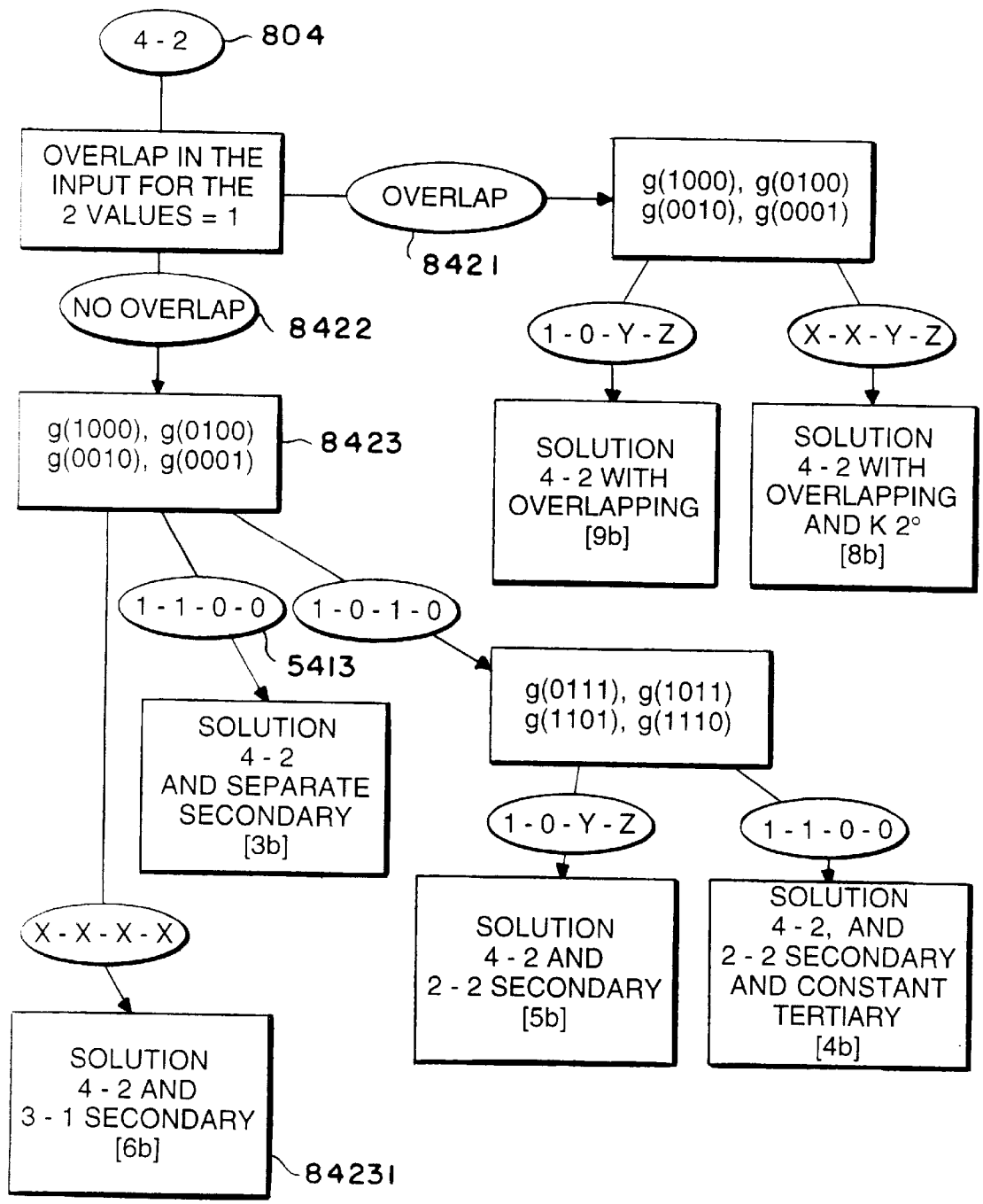
Figure 8D:
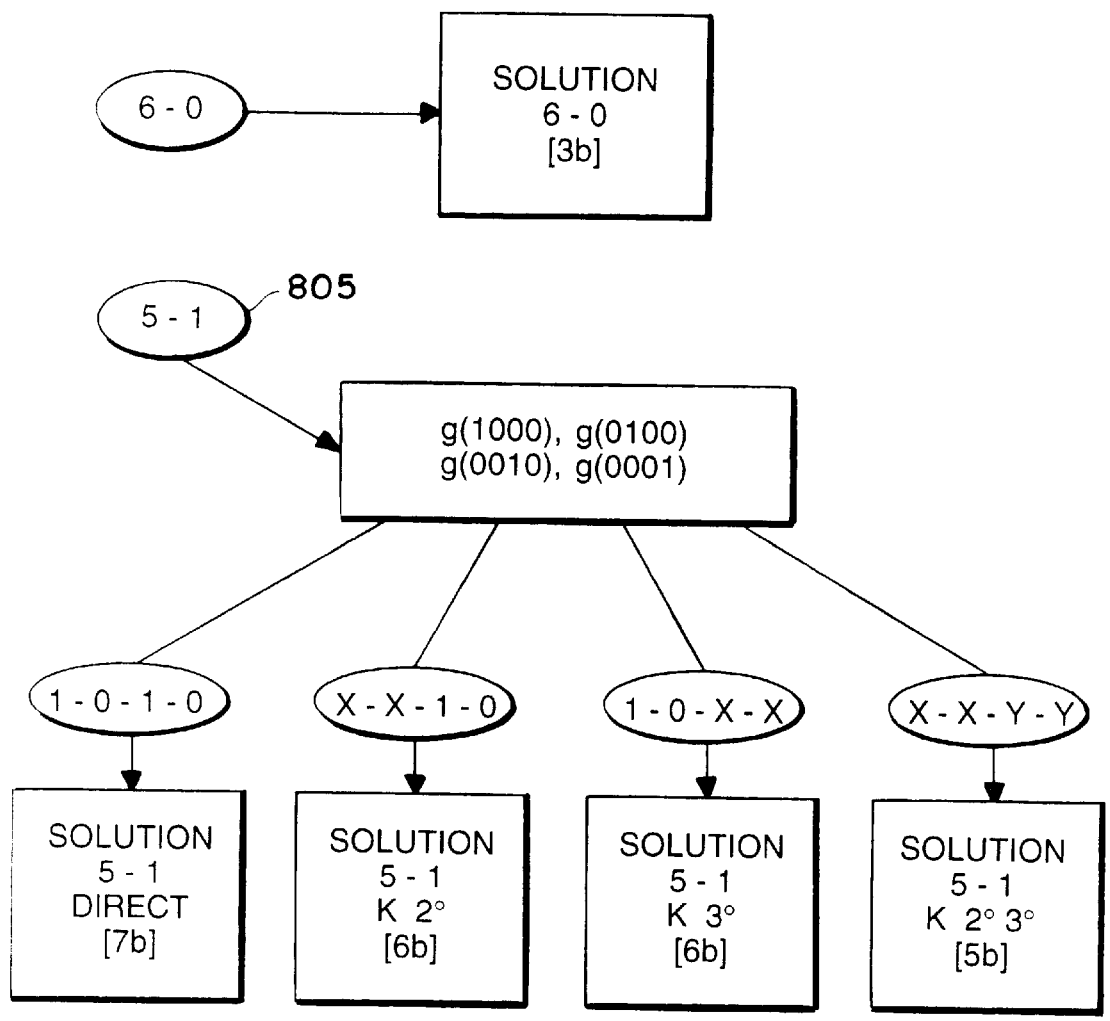

FIG. 7 gives the steps for the first example solution. It should be apparent that figures for the other examples would be similar.

Solution 4-2 with Overlapping

This example is the simplest and best one. Here, the eight initial values 701 submitted are $f(1100)=m_0$, $f(0110)=m_0$, $f(1010)=\sim m_0$, $f(1001)=\sim m_0$, $f(0101)=\sim m_0$, $f(0011)=\sim m_0$, $f(1000)=1$, and $f(9910)=0$. The other eight values for f $m_1, \ldots, m_8$, along $m_0$ are the message 702.

Permutation and Message Discovery Procedure

In step 710, probe the values stored in any one of the six memory locations $g(1100)$, $g(1010)$, $g(1001)$, $g(0110)$, $g(0101)$. The probe of $g(0011)$ is trivially the exclusive OR of the other five, two are set to a value (0 or 1) and the others are set to the opposite value. The value for the set of two is $m_0$.

If $g(a_0a_1a_2a_3)=g(b_0b_1b_2b_3)=m_0$, where $(a_0a_1a_2a_3)$ and $(b_0b_1b_2b_3)$ are different, the i for which $a_i=b_i=0$ is unique and correspond to the input which used to be in address position 3. The i for which $a_i=b_i=1$ is unique and correspond to the input which used to be in address position 1 (step 720). For i: ($a_i=1$ and $b_i=0$) and j: ($a_j=0$ and $b_j=1$), there is still an indetermination.

Therefore, probe $g(c_0c_1c_2c_3)$ where $c_i=1$ and $c_{k!=i}=0$. If $g(c_0c_1c_2c_3)=1$, then input i used to be in address position 0 and line j in position 2. If $g(c_0c_1c_2c_3)=0$, then input i used to be in position 2 and line j in address position 0 (step 730).

Now that the permutation is discovered, it is possible to retrieve the message $m_1 \ldots m_8$ from the other location in step 740. Overall, this method uses at most six probes, and can send a message of nine bits.

Solution 4-2 with Overlapping and Constant Secondary

Here, initial values are $f(1100)=m_0$, $f(0110)=m_0$, $f(1010)=\sim m_0$, $f(1001)=\sim m_0$, $f(0101)=\sim m_0$, $f(0011)=\sim m_0$, $f(1000)=m_1$, $f(0010)=m_1$, $f(0111)=1$, and $f(1101)=0$. The other 6 values for f are set to $m_2, \ldots, m_7$.

Permutation and Message Discovery Procedure

Probe the values of $g(1100)$, $g(1010)$, $g(1001)$, $g(0110)$, $g(0101)$. The probe of $g(0011)$ is trivially the exclusive OR of the other five of these six, two are set to a value (0 or 1) and the other 4 are set to the opposite value. The value for the set of two is $m_0$. If $g(a_0a_1a_2a_3)=g(b_0b_1b_2b_3)=m_0$, where $(a_0a_1a_2a_3)$ and $(b_0b_1b_2b_3)$ are different, then the i for which $a_i=b_i=0$ is unique and correspond to the address line which used to be in position 3.

The i for which $a_i=b_i=1$ is unique and correspond to the address line which used to be in position 1. For i: ($a_i=1$ and $b_i=0$) and j: ($a_j=0$ and $b_j=1$), there is still an indetermination. Therefore, probe $g(c_0c_1c_2c_3)$ where $c_i=0$ and $c_{k!=i}=1$. If $g(c_0c_1c_2c_3)=1$, then address line i used to be in address position 0, and line j in address position 2. If $g(c_0c_1c_2c_3)=0$, then address line i used to be in position 2 and line j in position 1. The probe of g() is done at the input with a single one placed in the new position of address line 0. This value is $m_1$.

Now that the permutation is discovered, it is possible to obtain the rest of the message $m_2 \ldots m_7$ from the other location. Overall, this method uses at most seven probes and can send a message of eight bits.

Solution 4-2 without Overlapping and 3-1 Secondary

The initial twelve values are $f(1100)=m_0$, $f(0011)=m_0$, $f(1010)=\sim m_0$, $f(1001)=\sim m_0$, $f(0101)=\sim m_0$, $f(0101)=\sim m_0$, $f(1000)=m_1$, $f(0100)=\sim m_1$, $f(0010)=\sim m_1$, $f(0001)=\sim m_1$, $f(1101)=1$, and $f(1110)=0$, and the other four values for f are set to $m_2, \ldots, m_5$.

Permutation and Message Discovery Procedure

Probe the values for $g(1000)$, $g(0100)$, $g(0010)$. The probe of $g(0001)$ is trivially the opposite of the exclusive OR of these 3 values. One of these for value is set to the opposite of the other three. The position on the 1 in the writing of the input of this value is the new position of input 0. The value itself is $m_1$.

Probe the values of $g(1100)$, $g(1010)$, $g(1001)$, $g(0110)$, $g(0101)$. The probe of $g(0011)$ is trivially the exclusive OR of the other five of these six, two are set to a value (0 or 1) and the other four are set to the opposite value. The value for the set of two is $m_0$. This has helped separating the problem in two as the two inputs that give $m_0$. Have two disjuncted sets of two 1s.

Because the new position of input 0 is known, it is possible to determined the new position of input 1 because it is in the same equivalence class of two ones as input 0. Additionally, the new positions of inputs 2 and 3 are known, but it is not possible to distinguish between the two. Now if i is one of the two new positions of input 3, probe $g(a_0a_1a_2a_3)$ where $a_i=0$ and $a_{k!=i}=1$.

If this value is 1 then i is the new position of input 3, else i is the new position of input 4. The new position of the input is the remaining one. Now that the permutation is discovered, the rest of the message $m_2, \ldots, m_5$ can be retrieved from the other location. Overall, this method uses at most nine probes and can send a message of six bits.

Solution 4-2 without Overlapping and 2-2 Secondary

Initial values are $f(1100)=m_0$, $f(0011)=m_0$, $f(1010)=\sim m_0$, $f(1001)=\sim m_0$, $f(0101)=\sim m_0$, $f(0101)=\sim m_0$, $f(1000)=1$, $f(0100)=0$, $f(0010)=1$, $f(0001)=0$, $f(0111)=1$, and $f(1101)=0$. The other four values for f are set to $m_1, \ldots, m_4$.

Permutation and Message Discovery Procedure

Probe for the values of $g(1000)$, $g(0100)$, $g(0010)$. The probe for $g(0001)$ is trivially the exclusive OR of the three values. Two values are set to 1 and two values are set to 0. The positions of the 1 in the writing of the inputs for the value 1 are the new positions of inputs 0 and 2. Take i as one of these new two positions. To differentiate between inputs 0 and 2, probe $g(a_0a_1a_2a_3)$ where $a_i=0$ and $a_{k!=i}=1$. If this value is 1, then i is the new position of input 0, else i is the new position of input 2. The position of the other one (resp. 2 and 0) is trivially the other one.

To differentiate between positions 1 and 3, probe the values of $f(1100)$, $g(1010)$, $g(1001)$, $g(0110)$, $g(0101)$. The probe of $g(0011)$ is trivially the exclusive OR of the other five of these six, two are set to a value (0 or 1) and the other four are set to the opposite value. The value for the set of two is $m_0$. This helped separating the problem in two as the two inputs that give $m_0$. Have two disjuncted sets of two 1s.

Because the new position of input 0 is known, the new position of input 1 is in the same set of two ones as the input 0. The same technique can be used for inputs 2 and 3. Now that the permutation is discovered, the rest of the message $m_1 \ldots m_4$ can be obtained from the other location. Overall, this method uses at most nine probes, and can send a message of five bits.

Solution 4-2 without Overlapping and 2-2 Secondary and Constant Tertiary

The initial values are $f(1100)=m_0$, $f(0011)=m_0$, $f(1010)=\sim m_0$, $f(1001)=\sim m_0$, $f(0101)=\sim m_0$, $f(0101)=\sim m_0$, $f(1000)=1$, $f(0100)=0$, $f(0010)=1$, $f(0001)=0$, $f(0111)=m_1$, $f(1101)=m_1$, $f(1011)=1$, and $f(1110)=0$. The other 2 values for f are set to $m_2, \ldots, m_3$ Permutation and Message Discovery Procedure Probe the values for $g(1000)$, $g(0100)$, $g(0010)$. The probe for $g(0001)$ is trivially the exclusive OR of these 3 values. Two values are set to 1 and two values are set to 0. The positions of the 1 in the writing of the inputs for the value 1 are the new positions of address lines 0 and 2. The others are the new positions for address lines 1 and 3. If i is one of these new two positions, then to differentiate between address lines 1 and 3, probe $g(a_0a_1a_2a_3)$ where $a_i=0$ and $a_{k!=i}=1$.

If this value is 1, then i is the new position of line 1, else i is the new position of line 3. The position of the other one, respectively 3 and 1, is trivially the other one.

To differentiate between 0 and 2, probe the values of g(1100), g(1010), g(1001), g(0110), g(0101). The probe of g(0011) is trivially the exclusive OR of the other five of these six, two are set to a value (0 or 1) and the other four are set to the opposite value. The value for the set of two is $m_0$. This has helped separating the problem in two as the two inputs that give $m_0$. Now there are two disjuncted sets of two 1s.

Because the new position of address line 0 is known, it is possible to determine the new position of 0, as it is in the same set of two ones as the address line 1. Likewise for positions 3 and 2 can be determined. The probe of g() is done with an input with a single 0 at the new position of 0. This is $m_1$. Now that the permutation is discovered, the rest of the message, $m_2, \ldots, m_3$, can be obtained from the other location. Overall, this method uses at most ten probes and can send a message of four bits.

Solution 4-2 without Overlapping and Separating Secondary

The initial values are f(1100)=$m_0$, f(0011)=$m_0$, f(1010)=~$m_0$, f(1001)=~$m_0$, f(0101)=~$m_0$, f(0101)=~$m_0$, f(1000)=1, f(0100)=1, f(0010)=0, f(0001)=0, f(0111)=1, f(1011)=0, f(1101)=1, and f(1110)=0. The other two values for f are set to $m_1 \ldots m_2$.

Permutation and Message Discovery Procedure

Probe the values of g(1100), g(1010), g(1001), g(0110), g(0101). The probe of g(0011) is trivially the exclusive OR of the other five of these six, two are set to a value (0 or 1) and the other 4 are set to the opposite value. The value for the set of two is $m_0$. Probe the value of g(1000), g(0100) and g(0010). The probe for g(0001) is the exclusive OR of the other three. Of these four values, two are set to 1 and two are set to 0. The position of the input lines set to 1 for the value of one are the new positions of address lines 0 and 1. The other two positions are the new position of address lines 2 and 3.

Probe of the value of g(0111), g(1011), g(1101), and g(1110). The probe of g(0111) is the exclusive OR of the other three. Looking at the inputs where there is a single 0 at the new positions for address lines 0 and 1, the new position of address line 0 is the position of the single 0 for a value of 1. The same is done to differentiate between address lines 2 and 3. Now that the permutation is discovered, the rest of the message $m_2 \ldots m_2$ is obtained from the other location. Overall, this method uses at most eleven probes and can send a message of three bits.

Solution 3-3 "Triangle"

Initial values are f(1100)=1, f(1010)=1, f(1001)=1, f(0110)=0, f(0101)=0, f(0011)=0, f(0100)=$m_0$, f(0010)=~$m_0$, f(0001)=~$m_0$, f(1101)=1, and f(1110)=0, and the other five values for f are set to $m_1 \ldots m_5$.

Permutation and Message Discovery Procedure

Probe the values of f(1100), f(1010), f(1001), f(0110), f(0101). The probe for f(0011) is trivially the exclusive OR of the other five of these six. Three values are 1, while the other three are 0. For the three at 1, one of the input bits is set to 1 all the time. This is the new position of address line 0. Probe three f() where only one input bit is set to 1. There are four of them, but do not probe the one where the 1 is in the new position of input 0. One value is the opposite of the other two. The position of the 1 in input for this value is the new position of input 1. The value is $m_0$.

Only the new positions of inputs 2 and 3 are unknown now, but they are constrained in two positions. To differentiate between positions 2 and 3, probe a single value with only one input bit set to 0, at one of the two possible new positions for input 2. If the value is 1, then this is the correct position, else it is the other one. The new position of the remaining input is obvious. Now that the permutation is discovered, we can also get the rest of the message $m_1 \ldots m_5$ from the other location. Overall, this method uses at most nine probes and can send a message of six bits.

Solution 3-3 "Z"

Initial values are f(1100)=1, f(0110)=1, f(0011)=1, f(1010)=0, f(1001)=0, f(0101)=0, f(1000)=1, and f(0001)=0, the other eight values for f are set to $m_0 \ldots m_7$.

Permutation and Message Discovery Procedure

Probe the values of f(1100), f(1010), f(1001), f(0110), f(0101). The probe for f(0011) is trivially the exclusive OR of the other five of these six. Three values are 1, while the other three are 0. If we count the number of occurrences of 1s in each of the inputs giving a value of 1, two positions have a single 1 and two positions have 1s. The single 1 positions are the new positions of inputs 0 and 3. To differentiate between input positions 0 and 3, probe f() with an input containing a single 1 at one of the two possible new positions for input 0. If the value is 1, then this is indeed the new positions for input 0, if not, it is the new position for input 3. We can then easily deduce the new position for the other input.

Once the new position of input 0 is known, we go back to the first set of six values. There is a single input giving out a value of 0 for which input 0 is set to 1. The other bit set to one in this input is the new position of input 1. We can easily deduce the position of input 2. Now that the permutation is discovered, we can also get the rest of the message $m_1 \ldots m_7$ from the other location. Overall, this method uses at most six probes and can send a message of eight bits.

Solution 3-3 "Z" Constant Secondary

The initial values are f(1100)=1, f(0110)=1, f(0011)=1, f(1010)=0, f(1001)=0, f(0101)=0, f(1000)=$m_0$, f(0001)=$m_0$, f(0100)=1, and f(0010)=0. The other 6 values for f are set to $m_1 \ldots m_6$.

Permutation and Message Discovery Algorithm:

Probe the values of g(1100), g(1010), g(1001), g(0110), g(0101). The probe of g(0011) is trivially the exclusive OR of the other five of these six. Three values are 1, while the other three are 0. If the number of occurrences of 1s in each of the inputs giving a value of 1 are counted, then two positions have a single 1 and two positions have 1s.

The single 1 positions are the new positions of address lines 0 and 3. The new positions of address lines 1 and 2 are the other two. To differentiate between 1 and 2, probe g() with an input containing a single 1 at one of the two possible new positions for address line 1. If the value is 1, then this is indeed the new position for address line 1, if not, it is the new position for address line 2. It is possible to deduce the new position for the other address line.

Once the new position of address lines 1 and 2 are known, the first set of six values can be used. There is a single input giving out a value of 1 for which address line 1 is set to 1. The other bit set to 1 in this input is the new position of address line 0, and the position of address line 3 can be deduced.

Probe g() with an input with a single 1 at the new position of address line 0. This value is $m_0$. Now that the permutation is discovered, the rest of the message $m_1 \ldots m_6$ can be obtained from the other location. Overall, this method uses at most seven probes and can send a message of seven bits.

Solution 3-3 "Z" Constant Secondary and Tertiary

The initial value are f(1100)=1, f(0110)=1, f(0011)=1, f(1010)=0, f(1001)=0, f(0101)=0, f(1000)=$m_0$, f(0001)=$m_0$, $f(0100)=m_1$, $f(0010)=m_1$, $f(0111)=1$, and $f(1110)=0$. The other four values for f are set to $m_2 \ldots m_5$.

Permutation and Message Discovery Procedure

Probe the values of $g(1100)$, $g(1010)$, $g(1001)$, $g(0110)$, $g(0101)$. The probe of $g(0011)$ is trivially the exclusive OR of the other five of these six. Three values are 1, while the other three are 0. Count the number of occurrences of 1s in each of the inputs giving a value of 1, two positions have a single 1 and two positions have 1s.

The single 1 positions are the new positions of address lines 0 and 3. To differentiate between 0 and 3, probe g() with an input containing a single 0 at one of the two possible new positions for address line 0. If the value is 1, 10 then this is indeed the new position for address line 0, if not, it is the new position for address line 3. The new position for the other address line can be deduced. Once we know the new position of address lines 0 and 3, go back to the first set of six values. There is a single input giving out a value of 1 for which address line 0 is set to 1. The other bit set to one in this input is the new position of address line 1, and the position of address line 2 can be determined.

The function g() is probed with an input with a single 1 at the new position of address line 0. This value is $m_0$. Probe g() with an input with a single 1 at the new position of address line 1. This value is $m_1$. Now that the permutation is discovered, the rest of the message $m_2 \ldots m_5$ is obtained from the other location. Overall, this method uses at most eight probes, and can send a message of six bits.

Solution 3-3 "Z" Constant Secondary, Tertiary and Quaternary

The initial values are $f(1100)=1$, $f(0110)=1$, $f(0011)=1$, $f(1010)=0$, $f(1001)=0$, $f(0101)=0$, $f(1000)=m_0$, $f(0001)=m_0$, $f(0100)=m_1$, $f(0010)=m_1$, $f(0111)=m_2$, $f(1110)=m_2$, $f(1011)=1$, and $f(1101)=0$. The other 2 values for f are set to $m_3 \ldots m_4$.

Permutation and Message Discovery Procedure

Probe the values of $g(1100)$, $g(1010)$, $g(1001)$, $g(0110)$, $g(0101)$. The probe of $g(0011)$ is trivially the exclusive OR of the other five of these six. Three values are 1, while the other three are 0. Count the number of occurrences of 1s in each of the inputs giving a value of 1, two positions have a single 1 and two positions have 1s. The single 1 positions are the new positions of address lines 0 and 3. The new positions of address lines 1 and 2 are the other two. To differentiate between 1 and 2, probe g() with an input containing a single 0 at one of the two possible new positions for address line 1. If the value is 1, then this is indeed the new position for address line 1 if not, it is the new position for address line 2. The new position for the other address line can be deduced.

Once the new position of address lines 1 and 2 are known, go back to the first set of six values. There is a single input giving out a value of 1 for which address line 1 is set to 1. The other bit set to 1 in this input is the new position of address line 0, and the position of address line 3 can be deduced.

Probe g() with an input with a single 1 at the new position of address line 0. This value is $m_0$. We probe g() with an input with a single 1 at the new position of address line 1. This value is $m_1$. Probe g() with an input with a single 0 at the new position of address line 0. This value is $m_2$. Now that the permutation is discovered, we can also get the rest of the message $m_3 \ldots m_4$ from the other location. Overall, this method uses at most nine probes and can send a message of five bits.

Solution for 5-1 Direct

The initial values are $f(1100)=m_0$, $f(0110)=\sim m_0$, $f(0011)=\sim m_0$, $f(1010)=\sim m_0$, $f(1001)=\sim m_0$, $f(0101)=\sim m_0$, $f(1000)=1$, $f(0100)=0$, $f(0010)=1$, and $f(0001)=0$. The other 6 values for f are set to $m_1 \ldots m_6$.

Permutation and Message Discovery Procedure

Probe the values of $g(1100)$, $g(1010)$, $g(1001)$, $g(0110)$, $g(0101)$. The probe of $g(0011)$ is trivially the opposite of the exclusive OR of the other five of these six. One value is the opposite of the other five. This value is $m_0$. The input for this value has two bits set to 1. These two bits are the new positions of the address lines 0 and 1.

To differentiate between address lines 0 and 1, probe go with an input with a single bit set to 1, at one of the two possible new positions for address line 0. If the probe returns a 1, then this is the correct new position for address line 0. If it returns a 0, then it is the new position for address line 1. The new position for the other address line is easy to find.

We now need to differentiate between the new positions of address lines 2 and 3. We use the same mechanism as the previous step. Now that the permutation is discovered, we can also get the rest of the message $m_1 \ldots m_6$ from the other locations. Overall, this method uses at most 7 probes and can send a message of 7 bits.

Solution 5-1 Constant Tertiary

The initial values are $f(1100)=m_0$, $f(0110)=\sim m_0$, $f(0011)=\sim m_0$, $f(1010)=\sim m_0$, $f(1001)=\sim m_0$, $f(0101)=\sim m_0$, $f(1000)=1$, $f(0100)=0$, $f(0010)=m_1$, $f(001)=m_1$, $f(1101)=1$, and $f(1110)=0$. The other 4 values for f are set to $m_2 \ldots m_5$.

Permutation and Message Discovery Procedure

Probe the values of $g(1100)$, $g(1010)$, $g(1001)$, $g(0110)$, $g(0101)$. The probe of $g(0011)$ is trivially the opposite of the exclusive OR of the other five of these six. One value is the opposite of the other five. This value is M. The input for this value has two bits set to 1. These two bits are the new positions of the address lines 0 and 1.

To differentiate between address lines 0 and 1, we probe g() with an input with a single bit set to 1, at one of the two possible new positions for address line 0. If the probe returns a 1, then this is the correct new position for address line 0. If it returns a 0, then it is the new position for address line 1. The new position for the other address line is easy to find. 3.

Probe g() with an input with a single bit set to 1, at one of the two possible new positions for address line 2. This value is $m_1$. Now, the new positions of address lines 2 and 3 need to be differentiated.

Probe g() with an input with a single bit set to 0 at, at one of the two possible new positions for address line 2. If the probe returns a 1, then this is the correct new position for address line 2. If it returns a 0, then it is the new position for address line 3. The new position for the other address line is easy to find. Now that the permutation is discovered, we can also get the rest of the message $m_2 \ldots m_5$ from the other locations. Overall, this method uses at most eight probes and can send a message of six bits.

Solution 5-1 Constant Secondary

The initial values are $f(1100)=m_0$, $f(0110)=\sim m_0$, $f(0011)=\sim m_0$, $f(1010)=\sim m_0$, $f(1001)=\sim m_0$, $f(0101)=\sim m_0$, $f(1000)=m_1$, $f(0100)=m_1$, $f(0010)=1$, $f(0001)=0$, $f(0111)=1$, and $f(1011)=0$. The other four values for f are set to $m_2 \ldots m_5$.

Permutation and Message Discovery Procedure

Probe the values of $g(1100)$, $g(1010)$, $g(1001)$, $g(0110)$, $g(0101)$. The probe of $g(0011)$ is trivially the opposite of the exclusive OR of the other five of these six. One value is the opposite of the other five. This value is $m_0$. The input for this value has two bits set to 1. These two bits are the new positions of the address lines 0 and 1.

Probe go with an input with a single bit set to 1, at one of the two possible new positions for address line 0. This value is $m_1$. To differentiate between address lines 2 and 3, we probe g() with an input with a single bit set to 1, at one of the two possible new positions for address line 2. If the probe returns a 1, then this is the correct new position for address line 2. If it returns a 0, then it is the new position for address line 3. The new position for the other address line is easy to find.

We now need to differentiate between the new positions of address lines 0 and 1. The function g() is probed with an input with a single bit set to 0 at, at one of the two possible new positions for address line 0. If the probe returns a 1, then this is the correct new position for address line 0. If it returns a 0, then it is the new position for address line 1. The new position for the other address line is easy to find. Now that the permutation is discovered, the rest of the message $m_2 \ldots m_5$ can be obtained from the other locations. Overall, this method uses at most eight probes and can send a message of six bits.

Solution 5-1 Constant Secondary and Tertiary

The initial values are $f(1100)=m_0$, $f(0110)=\sim m_0$, $f(0011)=\sim m_0$, $f(1010)=\sim m_0$, $f(1001)=\sim m_0$, $f(0101)=\sim m_0$, $f(1000)=m_1$, $f(0100)=m_1$, $f(1010)=\sim m_2$, $f(0001)=m_2$, $f(0111)=1$, $f(1011)=0$, $f(1101)=1$, and $f(1110)=0$. The other two values for f are set to $m_3 \ldots m_4$ Permutation and Message Discovery Procedure Probe the values of g(1100), g(1010), g(1001), g(0110), g(0101). The probe of g(0011) is trivially the opposite of the exclusive OR of the other five of these six. One value is the opposite of the other five. This value is M. The input for this value has two bits set to 1. These two bits are the new positions of the address lines 0 and 1.

To differentiate between address lines 0 and 1, we probe go with an input with a single bit set to 0, at one of the two possible new positions for address line 0. If the probe returns a 1, then this is the correct new position for address line 0. If it returns a 0, then it is the new position for address line 1. The new position for the other address line is easy to find.

To differentiate between the new positions of address lines 2 and 3, probe g() with an input with a single bit set to 1 at one of the two possible new positions for address line 2. If the probe returns a 1, then this is the correct new position for address line 2. If it returns a 0, then it is the new position for address line 3. The new position for the other address line is easy to find.

Probe g() with an input with a single bit set to 1, at the new position for address line 0. This value is $m_1$. Probe g() with an input with a single bit set to 1, at the new position for address line 2. This value is $m_2$. Now that the permutation is discovered, we can also get the rest of the message $m_2 \ldots m_5$ from the other locations. Overall, this method uses at most nine probes and can send a message of five bits.

Solution 6-0

Initial values are $f(1100)=m_0$, $f(0011)=m_0$, $f(1010)=m_0$, $f(1001)=m_0$, $f(0101)=m_0$, $f(0110)=m_0$, $f(1000)=1$, $f(0100)=1$, $f(0010)=0$, $f(0001)=0$, $f(0111)=1$, $f(1011),=0$, $f(1101)=1$, and $f(1110)=0$, while the other three values for f are set to $m_0 \ldots m_2$.

Permutation and Message Discovery Procedure

Probe g(1100). The value is $m_0$. Probe g(1000), g(0100) and g(0010) and find g(0001) which is the exclusive OR of the other ones. Deduce the two possible new positions of inputs 0 and 1. Probe f(0111), f(1011) and f(1101) and find g(1110) which is the exclusive OR of the other ones. Deduce the exact new positions of inputs 0, then 2. The new positions for 1 and 3 are then obvious. Now that the permutation is discovered, we can also get the rest of the message $m_1 \ldots m_2$ from the other location. This method uses at most seven probes and can send a message of three bits.

IV—Combination of Solutions

As shown in FIGS. 8A–8D, the length of the message can be increased by combining the above solutions. Here, the principle is that each solution has a different "signature."

Probes 801 on the six values g(1100), g(1010), g(1001), g(0110), g(0101) and g(0011) 802 easily reveal the 3-3 (803), 4-2 (804), 5-1 (805) and 6-0 (506) solutions, as they have a different number of values set to 1, hence their naming. Within each type, the presented solutions can easily be recognized: 4-2 (804) with overlapping 8421, and without overlapping 8422. The two inputs that give $m_0$, the "with overlapping" has an input bit set to 1 in the two inputs (842). The "without overlapping" version 8422 has disjuncted sets of 1s.

In the 4-2 no-overlap solution, the disjunct sets differ on their secondary choice: on g(1000), g(0100), g(0010) and g(0001) (8423) in the 3-1 case (84231), three values are the same, in the 2-2 case, 2 values are the same. 4-2 without overlapping and separating secondary: this special case has a useless configuration for g(1000), g(0100), g(0010) and g(0001), but is a recognizable configuration (due to this useless configuration), and thus brings more message bits to the combination.

The names for the 3-3 "triangle" and "Z" solutions come from the tetrahedron view of the problem. On probing the values g(1100), g(1010), g(1001), g(0110), g(0101) and g(0011), three are set to 1. If on the three inputs for these values, one of the bits has always the same value, then it is a "triangle," otherwise, it is a "Z".

For the direct/constant secondary (K 2°)/constant tertiary (3°)/constant secondary and tertiary, these solutions differ by the value of the pairs g(1000)-g(0100), g(0010)-g(0001). The four variants come from the four different possibilities where the elements of the pairs are either identical or different. Likewise for the other solutions, use a difference in pairs where the two elements of the pair can be either equal or different.

The other solutions can similarly be probed and discovered as shown in FIGS. 8A–8D and described above. Each of these solutions is capable of encoding messages of a certain number of bits, indicated as "[nb]" in the bottom of the solution boxes of FIGS. 8A–8D.

When encoding a message by first choosing a solution and then using the solution to encode the message, the capabilities of all of the solutions can be combined. The receiving side just has to recognize the particular solution by using the criteria defined above, then proceed normally.

It is important to note that the test functions for each of the solutions are distinct from each other. This property ensures the unicity of the solution for a given test function. Each solution uses a subset of the exhaustive set of useful classes as described above. The intent is that the entire solution space can be covered with disjoint and recognizable solutions.

EXAMPLE

The 4-2 with overlapping solution can encode nine bit messages, which means a message M: $0<=M<2^9=512$. The 3-3 "Z" solution can encode eight bit messages, which means a message M: $0<=M<2^8=256$. The solutions can be combined to allow a message of 9.5 bits: M: $0<=M<2^{9.5}=512+256=768$ as follows. If $M<=2^9$, then encode M using the 4-2 with overlapping solution. If $M>=2^9$, then encode $M-2^9$ using 3-3 "Z" solution.

Figure 9:
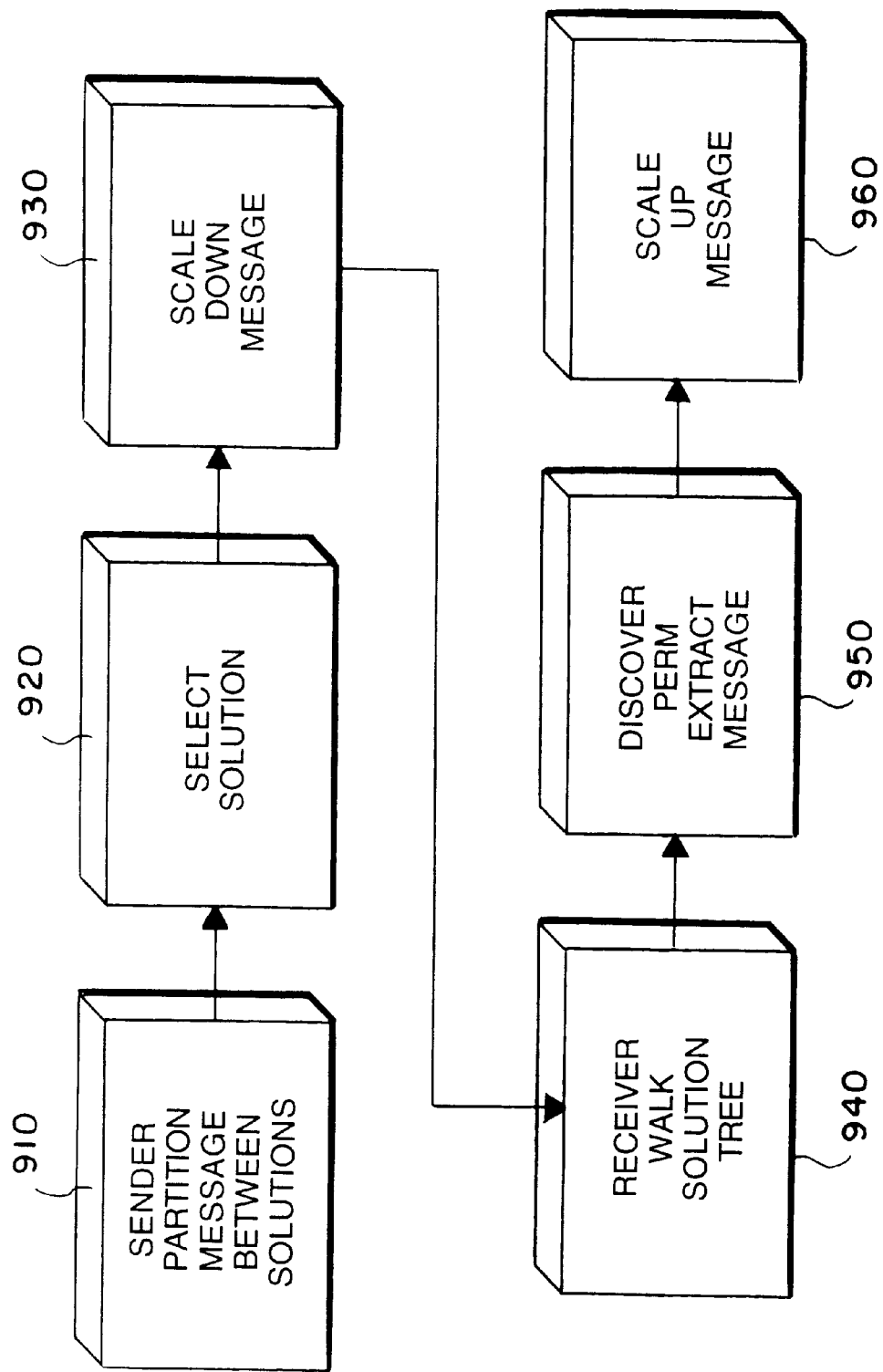
FIG. 9 is a flow diagram for sending a scaled message to a receiver.

The combined solution as shown in FIG. 8 can be reached by the steps shown in FIG. 9. In step 910, the sender partitions the message space between the different solutions. In step 920, the sender selects a solution according to the position of the message in the partitioned space. In step 930, the message is scaled down into the solution space.

In step 940, the receiver walks the tree of FIG. 8 until the selected solution is found. In step 950, discover the permutation and extract the message according to the selected solution. In step 960, scales up the message according to the position of the solution in the partitioned message space.

The maximum combined capabilities of all the preceding algorithms is:

$$M < 2^9 + 2^8 + 2^6 + 2^5 + 2^4 + 2^3 + 2^7 + 2^8 + 2^7 + 2^6 + 2^5 + 2^7 + 2^6 + 2^6 2^5 + 2^3 = 1792 = 2^{10.81}.$$

Therefore, it is possible to encode 10.81 bits with the combined solution. Note that the number of probes is at least six to recognize the first level of solutions, but then can vary. The complexity is just the maximum complexity of the individual solutions, which is not very large.

The combined solution reaches the theoretical bound, and is therefore optimal. Finding all the sub-solutions of the combination is straightforward in most cases. If it becomes difficult to find additional solutions, then the coverage of solution can be mapped to the exhaustive list of the classes to determine what patterns are missing. The same basic technique can be used in the case where n=5, although this will take more time.

Although the example embodiments given here are for determining the permutation of address lines in a FPGA, the same technique can be used in a larger setting to identify for example, telephone cabling in a building, or any other type of large scale cabling where the internal routing information is no longer available.

The foregoing description has been directed to specific embodiments of this invention. It will be apparent, however, that variations and modifications may be made to the described embodiments, with the attainment of all or some of the advantages. Therefore, it is the object of the appended claims to cover all such variations and modifications as come within the spirit and scope of the invention.

We claim:

1. A method for determining a random permutation of input lines of a logic element of a source design that produces a permuted set of bits in a bitstream representing the source design, comprising the steps of:

replacing the logic element having permutable input lines with a test function to generate the bitstream including the permuted set of bits;

probing the test function with test values to obtain test results; and comparing the test results with the permuted set of bits to discover the random permutation of the input lines.

2. The method of claim 1 including correctly reading the permuted set of bits using the random permutation.

3. The method of claim 2 including patching the bitstream using the random permutation to produce a patched bitstream.

4. The method of claim 3 including:

processing the patched bitstream by an FPGA to configure the FPGA for use.

5. The method of claim 1 wherein the values include a message.

6. The method of claim 1 including:

probing the test function using an exhaustive classification of all possible test functions.

7. The method of claim 6 wherein all possible test functions are assigned to equivalence classes, and a particular test function in a particular equivalence class is a permutation of any other test function in the same equivalence class, and the particular test function has no relation with test function in other equivalence classes.

8. The method of claim 7 where an equivalence class of cardinality n factorial is a useful class for discovering the permutation.

9. The method of claim 1 including probing the test function bit by bit, each probe discovering one additional bit of the permuted set of bits.

10. The method of claim 9 where $n.\log_2(n)$ probes are required.

11. The method of claim 5 wherein four input lines produce sixteen bits in the permuted set, a subset of the sixteen values being the message.

12. The method of claim 5 wherein a plurality of test functions are combined to maximize the size of the message.

13. The method of claim 3 including patching the patched bitstream.

14. The method of claim 1 wherein the replaced logic element is processed by design a design tool that permute the input lines of the replaced logic element.

15. The method of claim 14 wherein the logic element is a look-up table.

* * * * *